US011594396B2

(12) United States Patent
Ren et al.

(10) Patent No.: US 11,594,396 B2
(45) Date of Patent: Feb. 28, 2023

(54) MULTI-BEAM INSPECTION APPARATUS WITH SINGLE-BEAM MODE

(71) Applicant: ASML Netherlands B.V., Veldhoven (NL)

(72) Inventors: Weiming Ren, San Jose, CA (US); Xuedong Liu, San Jose, CA (US); Xuerang Hu, San Jose, CA (US); Zhong-Wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/834,778

(22) Filed: Mar. 30, 2020

(65) Prior Publication Data

US 2020/0321191 A1 Oct. 8, 2020

Related U.S. Application Data

(60) Provisional application No. 62/981,462, filed on Feb. 25, 2020, provisional application No. 62/826,731, filed on Mar. 29, 2019.

(51) Int. Cl.
*H01J 37/20* (2006.01)
*H01J 37/317* (2006.01)
(Continued)

(52) U.S. Cl.
CPC ........ *H01J 37/3177* (2013.01); *H01J 37/145* (2013.01); *H01J 37/147* (2013.01);
(Continued)

(58) Field of Classification Search
CPC ....... H01J 2237/0453; H01J 2237/0458; H01J 2237/2817; H01J 37/09; H01J 37/145;
(Continued)

(56) References Cited

U.S. PATENT DOCUMENTS 7,906,761 B2 * 3/2011 Tanimoto ................ H01J 37/28
250/310
8,294,125 B2 * 10/2012 Han ........................ H01J 37/28
250/397
(Continued)

FOREIGN PATENT DOCUMENTS

CN 103238202 B 11/2016
CN 108292583 A 7/2018
(Continued)

OTHER PUBLICATIONS

International Search Report issued by the International Searching Authority in related PCT International Application No. PCT/EP2020/057176, dated Jun. 19, 2020 (3 pgs.).
(Continued)

*Primary Examiner* — Wyatt A Stoffa
(74) *Attorney, Agent, or Firm* — Finnegan, Henderson, Farabow, Garrett & Dunner, LLP

(57) ABSTRACT

A multi-beam inspection apparatus supporting a plurality of operation modes is disclosed. The charged particle beam apparatus for inspecting a sample supporting a plurality of operation modes comprises a charged particle beam source configured to emit a charged particle beam along a primary optical axis, a movable aperture plate, movable between a first position and a second position, and a controller having circuitry and configured to change the configuration of the apparatus to switch between a first mode and a second mode. In the first mode, the movable aperture plate is positioned in the first position and is configured to allow a first charged particle beamlet derived from the charged particle beam to pass through. In the second mode, the movable aperture plate is positioned in the second position and is configured to allow the first charged particle beamlet and a second charged particle beamlet to pass through.

14 Claims, 13 Drawing Sheets

(51) Int. Cl.
    *H01J 37/145* (2006.01)
    *H01J 37/147* (2006.01)
    *H01J 37/244* (2006.01)

(52) U.S. Cl.
    CPC ............ *H01J 37/20* (2013.01); *H01J 37/244* (2013.01); *H01J 2237/0453* (2013.01); *H01J 2237/2817* (2013.01)

(58) Field of Classification Search
    CPC ........ H01J 37/147; H01J 37/20; H01J 37/244; H01J 37/28; H01J 37/3177
    USPC .......................................................... 250/310
    See application file for complete search history.

(56) References Cited

U.S. PATENT DOCUMENTS

| | | | |
|---|---|---|---|
| 9,140,998 B2* | 9/2015 | Smilde | G03F 7/70641 |
| 9,384,938 B2* | 7/2016 | Zeidler | B82Y 10/00 |
| 9,691,586 B2 | 6/2017 | Ren et al. | |
| 9,741,525 B1* | 8/2017 | Sed'a | H01J 37/09 |
| 9,905,391 B2* | 2/2018 | Jiang | H01J 37/05 |
| 2008/0230697 A1 | 9/2008 | Tanimoto et al. | |
| 2012/0061565 A1 | 3/2012 | Enyama et al. | |
| 2016/0155603 A1* | 6/2016 | Zeidler | H01J 37/09 250/396 R |
| 2016/0268096 A1 | 9/2016 | Ren et al. | |
| 2017/0025243 A1* | 1/2017 | Ren | H01J 37/10 |
| 2017/0154756 A1* | 6/2017 | Ren | H01J 37/14 |
| 2018/0254167 A1* | 9/2018 | Zhao | H01J 37/222 |
| 2022/0005665 A1* | 1/2022 | Ren | H01J 37/141 |

FOREIGN PATENT DOCUMENTS

| | | |
|---|---|---|
| JP | 2008215969 A | 9/2008 |
| JP | 2009134926 A | 6/2009 |
| TW | 201910757 A | 3/2019 |
| WO | WO 2007/028595 A2 | 3/2007 |
| WO | WO 2010/137257 A1 | 12/2010 |
| WO | WO 2018/122176 A1 | 7/2018 |
| WO | WO 2018/197169 A1 | 11/2018 |

OTHER PUBLICATIONS

Office Action of the Intellectual Property Office of Taiwan issued in related Taiwanese Patent Application No. 109109816; dated Jan. 28, 2021 (13 pgs.).

Office Action of the Intellectual Property Office issued in related Taiwanese Patent Application No. 109109816; dated Aug. 19, 2022 (11 pgs.).

Notice of Reasons for Rejection issued by the Japan Patent Office in related Japanese Patent Application No. 2021-555244; dated Nov. 1, 2022 (11 pgs.).

* cited by examiner

MULTI-BEAM INSPECTION APPARATUS WITH SINGLE-BEAM MODE

CROSS-REFERENCE TO RELATED APPLICATIONS

This application claims priority of U.S. application 62/826,731 which was filed on Mar. 29, 2019, and U.S. application 62/981,462, which was filed on Feb. 25, 2020, both of applications of which are hereby incorporated by reference in their entireties.

FIELD

The embodiments provided herein generally relate to a multi-beam inspection apparatus, and more particularly, a multi-beam inspection apparatus supporting a plurality of operation modes.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the sample. By scanning the probe spot over the sample surface and collecting the secondary electrons, pattern inspection tools may obtain an image of the sample surface.

SUMMARY

The embodiments provided herein disclose a multi-beam inspection apparatus, and more particularly, a multi-beam inspection apparatus supporting a plurality of operation modes.

In some embodiments, the charged particle beam apparatus for inspecting a sample supports a plurality of operation modes. The charged particle beam apparatus comprises a charged particle beam source configured to emit a charged particle beam along a primary optical axis, a first aperture plate configured to form a plurality of charged particle beamlets from the charged particle beam, and a second aperture plate, movable between a first position and a second position. The charged particle beam apparatus also comprises a controller having circuitry and configured to change the configuration of the apparatus to switch between a first mode and a second mode. When the apparatus operates in the first mode, the second aperture plate is positioned in the first position, and the first aperture plate and the second aperture plate are configured to allow a first charged particle beamlet of the plurality of charged particle beamlets to pass through. When the apparatus operates in the second mode, the second aperture plate is positioned in the second position, and the first aperture plate and the second aperture plate are configured to allow the first charged particle beamlet and a second charged particle beamlet of the plurality of charged particle beamlets to pass through.

In some embodiments, a method of inspecting a sample using a charged particle beam apparatus is disclosed. The charged particle beam apparatus can include a first aperture plate configured to form a plurality of charged particle beamlets from a charged particle beam emitted by a charged particle beam source. The method comprises moving a second aperture plate from a second position to a first position, wherein positioning of the second aperture plate at the first position enables a single charged particle beamlet of the charged particle beam to pass through the combination of the first and second aperture plates, and positioning of the second aperture plate at the second position enables a plurality of charged particle beamlets of the charged particle beam to pass through the combination of the first and second aperture plates.

In some embodiments, the charged particle beam apparatus for inspecting a sample supporting a plurality of operation modes comprises a charged particle beam source configured to emit a charged particle beam along a primary optical axis, a movable aperture plate, movable between a first position and a second position, and a controller having circuitry and configured to change the configuration of the apparatus to switch between a first mode and a second mode. When the apparatus operates in the first mode, the movable aperture plate is positioned in the first position and is configured to allow a first charged particle beamlet of a plurality of charged particle beamlets derived from the charged particle beam to pass through. When the apparatus operates in the second mode, the movable aperture plate is positioned in the second position and is configured to allow the first charged particle beamlet and a second charged particle beamlet of the plurality of charged particle beamlets to pass through.

In some embodiments, the charged particle beam apparatus also includes multiple electron detection devices. In some embodiments, a first electron detection device is configured to detect secondary electrons emerged from the sample in the first mode, while a second electron detection device and/or a third electron device is configured to detect the secondary electrons in the second mode.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
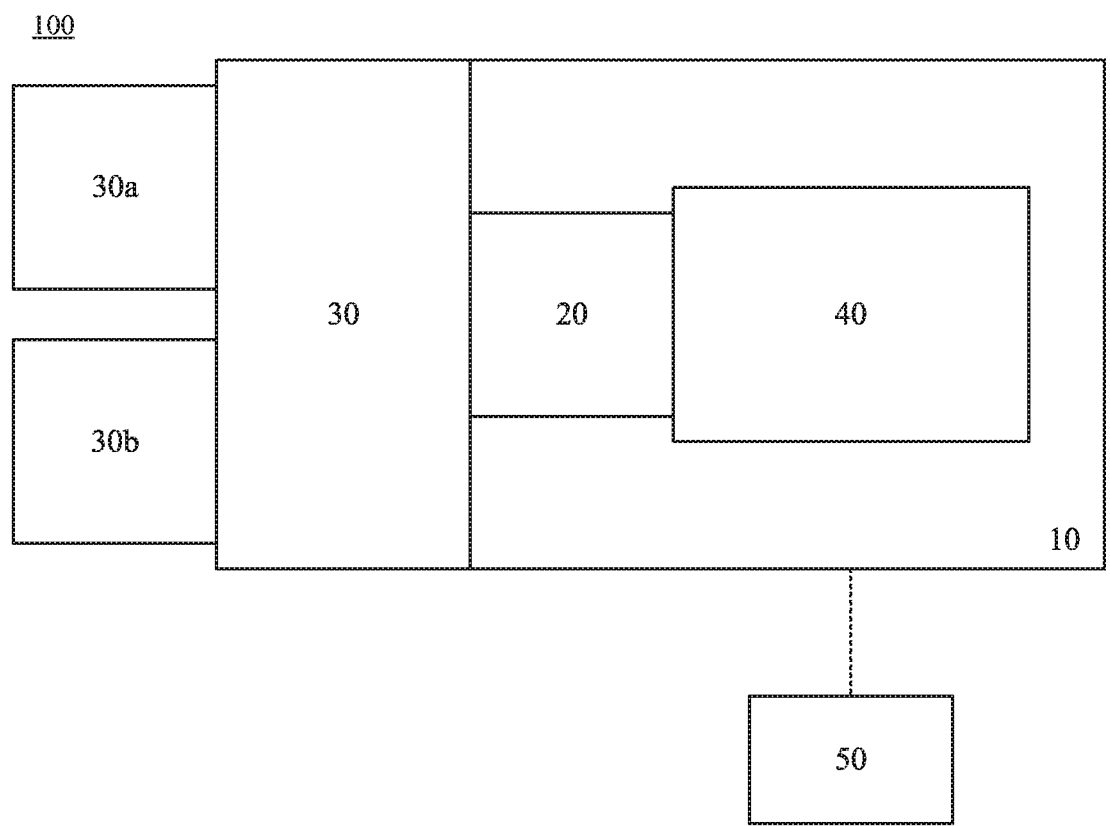
FIG. 1 is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective then the process can be adjusted so the defect is less likely to occur again.

A SEM scans the surface of a sample with a focused beam of primary electrons. The primary electrons interact with the sample and generate secondary electrons. By scanning the sample with the focused beam and capturing the secondary electrons with a detector, the SEM creates an image of the scanned area of the sample.

For high throughput inspection, some of the inspection systems use multiple focused beams of primary electrons. As the multiple focused beams can scan different parts of a wafer at the same time, multi-beam inspection system can inspect a wafer at a much higher speed than a single-beam inspection system. However, a conventional multi-beam inspection system can suffer low inspection accuracy and low resolution due to the crosstalk between adjacent electron beams. Therefore, once the conventional multi-beam inspection system detects defects on the sample, it is often required to transfer the sample to a high-resolution single-beam review tool to perform closer inspection of the detected defects. Even though some of newer multi-beam inspection systems provide a dual-mode support (e.g., a multi-beam mode and a single-beam mode), the max resolution during the single-beam mode operation is lower than the resolution that can be achieved with a conventional single-beam review tool.

One of the main sources of limited resolution during the single-beam mode operation is the existence of off-axis electron beams that are not used when the multi-beam inspection systems operates in the single-beam mode. Because an electron source, such as an electron gun, generates as many electrons as it would generate in the multi-beam mode, the adverse influence among electrons in the single-beam mode is as high as in the multi-beam mode, even though off-axis electron beams ultimately get filtered in the downstream. For example, source conversion unit 220 in FIG. 2 can adjust the beamlets 712 and 713 in FIG. 7A to be blocked by detector 746 in FIG. 7B or an aperture (not shown) so as not to land on the sample. One aspect of the present disclosure includes an adaptive control mechanism of electron beam generation that can eliminate the unused off-axis electron beams near the electron beam source before they influence the on-axis electron beam, and accordingly reduce the deterioration of the single-beam, when the tool operates in the single-beam mode.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which is a schematic diagram illustrating an exemplary charged particle beam inspection system 100, consistent with embodiments of the present disclosure. As shown in FIG. 1, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

A controller 50 is electronically connected to electron beam tool 40. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure.

While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
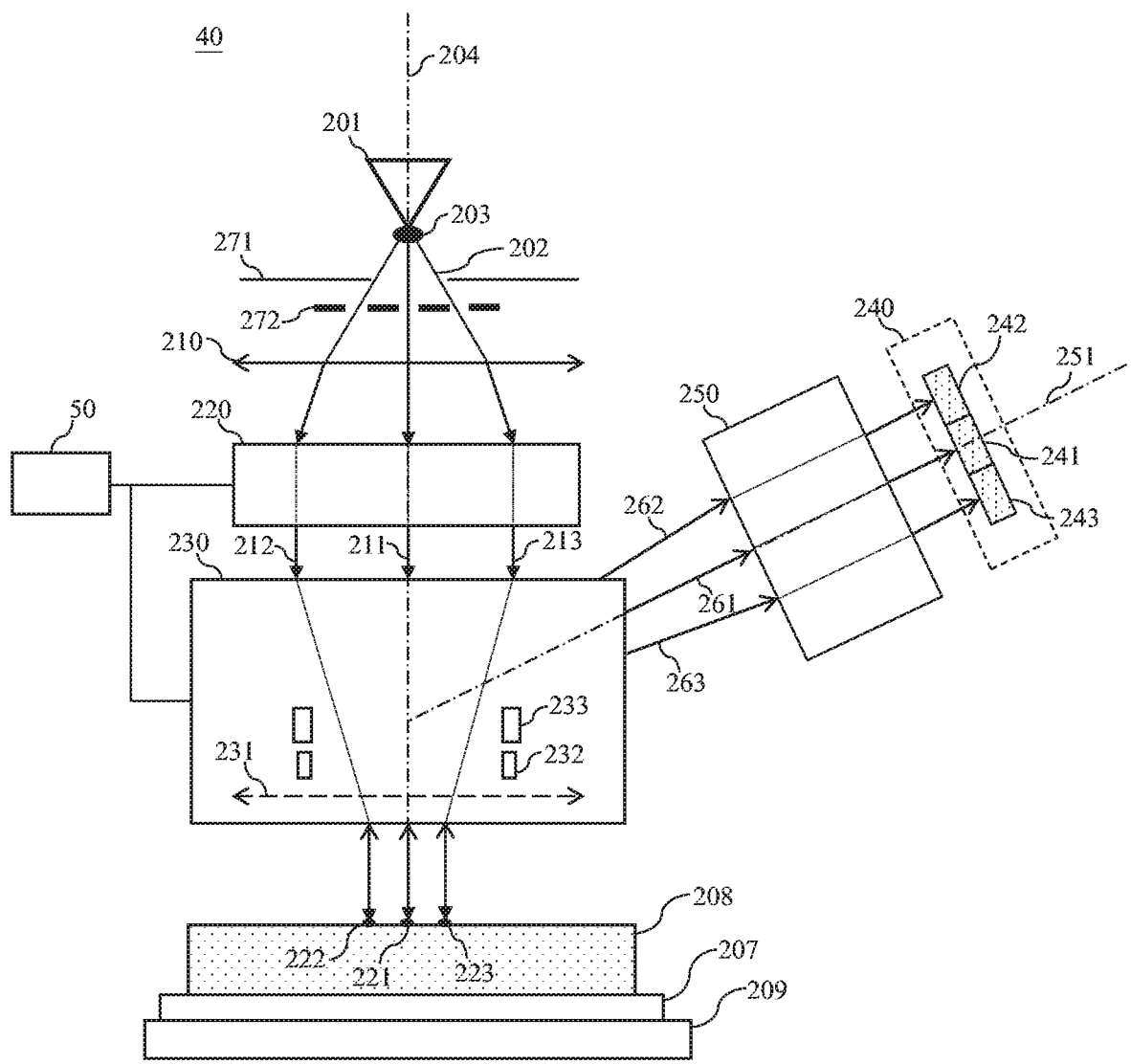
FIG. 2 is a schematic diagram illustrating an exemplary multi-beam apparatus that is part of the exemplary charged particle beam inspection system of FIG. 1, consistent with embodiments of the present disclosure.

Reference is now made to FIG. 2, which is a schematic diagram illustrating an exemplary electron beam tool 40 including a multi-beam inspection tool that is part of the exemplary charged particle beam inspection system 100 of FIG. 1, consistent with embodiments of the present disclosure. Multi-beam electron beam tool 40 (also referred to herein as apparatus 40) comprises an electron source 201, a gun aperture plate 271, a pre-beamlet-forming aperture array 272, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 40 may further comprise a secondary projection system 250 and an electron detection device 240. Primary projection system 230 may comprise an objective lens 231. A beam separator 233 and a deflection scanning unit 232 may be positioned inside primary projection system 230. Electron detection device 240 may comprise a plurality of detection elements 241, 242, and 243.

Electron source 201, gun aperture plate 271, a pre-beamlet-forming aperture array 272, condenser lens 210, source conversion unit 220, beam separator 233, deflection scanning unit 232, and primary projection system 230 may be aligned with a primary optical axis 204 of apparatus 40. Secondary projection system 250 and electron detection device 240 may be aligned with a secondary optical axis 251 of apparatus 40.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiment, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 50 may be connected to various parts of charged particle beam inspection system 100 of FIG. 1, such as source conversion unit 220, electron detection device 240, primary projection system 230, or motorized stage 209. In some embodiments, as explained in further details below, controller 50 may perform various image and signal processing functions. Controller 50 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Accordingly, condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto sample 208 for inspection and may form, in the current embodiments, three probe spots 221, 222, and 223 on the surface of sample 208. Deflection scanning unit 232, in operation, is configured to deflect primary beamlets 211, 212, and 213 to scan probe spots 221, 222, and 223 across individual scanning areas in a section of the surface of sample 208. Gun aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution. In some embodiments, pre-beamlet-forming aperture array 272 further cuts the peripheral electrons of primary electron beam 202 to reduce the Coulomb effect. Primary-electron beam 202 may be trimmed into three beamlets 211, 212 and 213 by pre-beamlet-forming aperture array 272.

In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy≤50 eV) and backscattered electrons (having electron energy between 50 eV and the landing energy of primary beamlets 211, 212, and 213).

Beam separator 233 may be a Wien filter comprising an electrostatic deflector generating an electrostatic dipole field and a magnetic lens generating a magnetic dipole field (not shown). In operation, beam separator 233 may be configured to generate the electrostatic dipole field using the electrostatic deflector to exert electrostatic force on individual electrons of primary beamlets 211, 212, and 213. Beam separator 233 may also be configured to generate magnetic dipole field to exert magnetic force on the electrons. The electrostatic force is equal in magnitude but opposite in direction to the magnetic force. Primary beamlets 211, 212, and 213 may therefore pass at least substantially straight through beam separator 233 with at least substantially zero deflection angles.

However, secondary electron beams 261, 262, and 263 may be deflected towards secondary projection system 250, which subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals that are sent to controller 50 or a signal processing system (not shown), e.g. to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 50). In some embodiments, each detection element 241, 242, and 243 may comprise one or more pixels. The intensity signal output of a detection element may be a sum of signals generated by all the pixels within the detection element.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 50 may be configured to perform image processing steps with the multiple images of the same location of sample 208.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 50 may control motorized stage 209 to move sample 208 during inspection of sample 208. In some embodiments, controller 50 may enable motorized stage 209 to move sample 208 in a direction continuously at a constant speed. In other embodiments, controller 50 may enable motorized stage 209 to change the speed of the movement of sample 208 over time depending on the steps of scanning process. In some embodiments, controller 50 may adjust a configuration of primary projection system 230 or secondary projection system 250 based on images of secondary electron beams 261, 262, and 263.

Although FIG. 2 shows that electron beam tool 40 uses three primary electron beams, it is appreciated that electron beam tool 40 may use two or more number of primary electron beams. The present disclosure does not limit the number of primary electron beams used in apparatus 40.

In some embodiments, a multi-beam apparatus may provide a mechanism to support a single-beam mode operation. For example, a multi-beam apparatus may control a deflector array (e.g., a deflector array in source conversion unit 220 of FIG. 2) to adjust deflection angles of a plurality of primary beamlets (such as beamlets 211, 212, and 213 in FIG. 2) such that only one of the plurality of primary beamlets would arrive at the surface of the sample (such as sample 208 of FIG. 2). Examples of a multi-beam apparatus supporting a single-mode operation can be found in U.S. Pat. No. 9,691,586, which is incorporated by reference in its entirety. To acquire higher resolution images of the sample using the single-beam mode, it may be desired to further reduce the Coulomb effect. In some embodiments, if a multi-beam apparatus in a single-beam mode can have a resolution as good as a conventional single-beam apparatus, the multi-beam apparatus may at first perform multi-beam inspection, which typically provides higher throughput than the conventional single-beam apparatus, and then perform high-resolution review of the defect of interest using the single-beam mode. This may eliminate the need of a conventional single-beam review tool for the second step. Moreover, this may also improve the overall throughput of inspection process as the high-throughput inspection step and the high-resolution review step can be performed within one tool so that the time to transfer the sample from a first tool to a second tool can be saved.

Figure 3A:
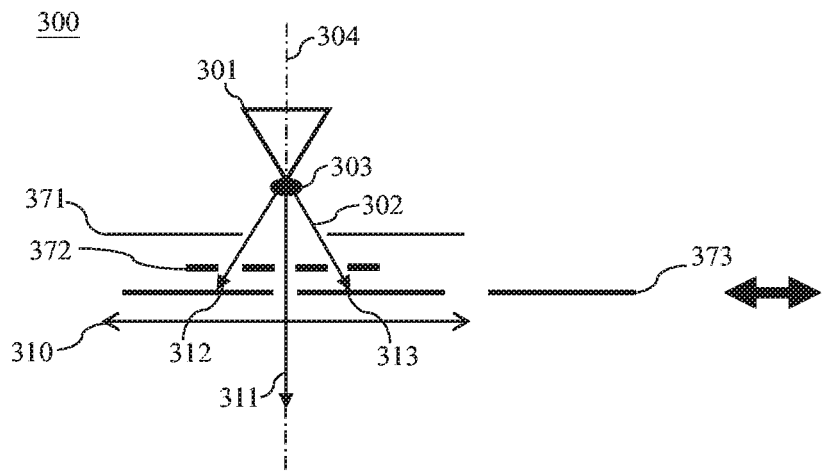
FIGS. 3A and 3B are schematic diagrams of a multi-beam electron beam tool illustrating an exemplary configuration of a movable aperture plate, consistent with embodiments of the present disclosure.
Figure 3B:
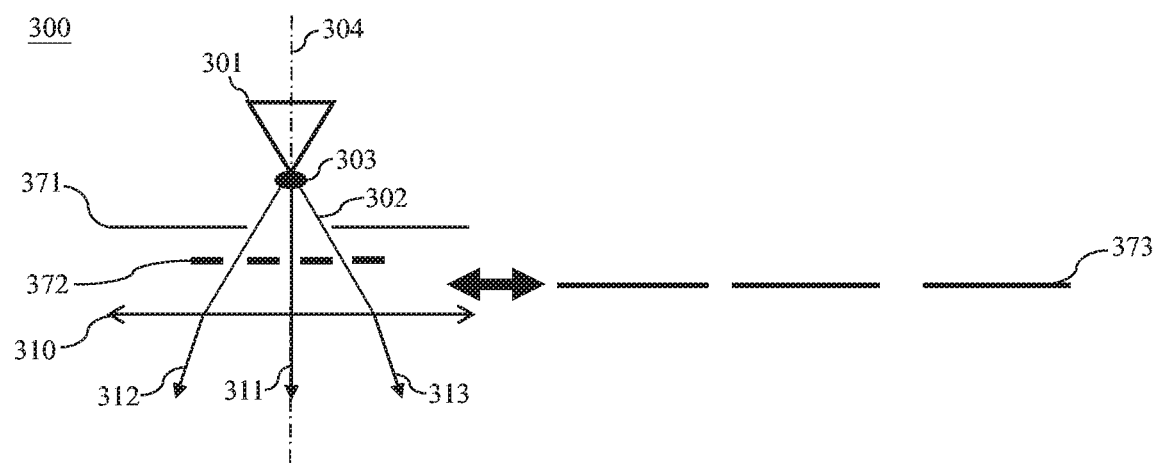

Reference is now made to FIGS. 3A and 3B, which are schematic diagrams of a multi-beam electron beam tool 300 illustrating an exemplary configuration of a movable aperture plate 373, consistent with embodiments of the present disclosure. Multi-beam electron beam tool 300 may be part of a multi-beam apparatus (such as multi-beam apparatus 40 of FIG. 2).

As described earlier with respect to FIG. 2, multi-beam electron beam tool 300 may include an electron source 301, a gun aperture plate 371, a pre-beamlet-forming aperture array 372, and a condenser lens 310. Electron source 301 is configured to emit primary electrons and form a primary electron beam 302. Gun aperture plate 371 is configured to block off peripheral electrons of primary electron beam 302 to reduce the Coulomb effect, which may deteriorate inspection resolution. In some embodiments, pre-beamlet-forming aperture array 372 further cuts the peripheral electrons of primary electron beam 302 to reduce the Coulomb effect. Primary-electron beam 302 may be trimmed into three primary electron beamlets 311, 312 and 313 (or any other number of beamlets) after passing pre-beamlet-forming aperture array 372. Electron source 301, gun aperture plate 371, pre-beamlet-forming aperture array 372, and condenser lens 310 may be aligned with a primary optical axis 304 of multi-beam electron beam tool 300.

In some embodiments, multi-beam electron beam tool 300 may further include movable aperture plate 373 that may be used to support multiple operation modes of electron beam tool 300, such as a single-beam mode and a multi-beam mode.

Figure 3C:
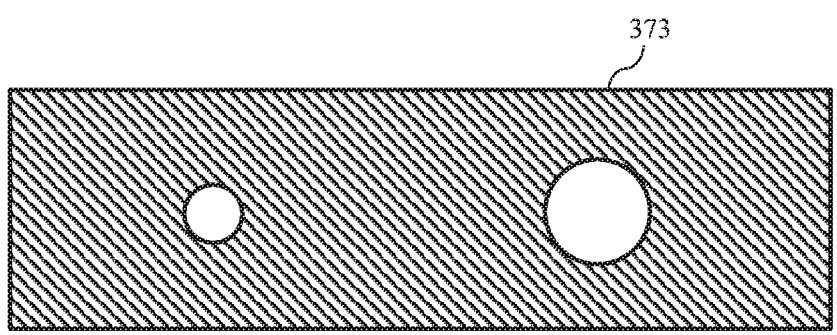
FIG. 3C is a schematic diagram of an embodiment of the movable aperture plate of FIGS. 3A and 3B, consistent with embodiments of the present disclosure.

In the single-beam mode, as shown in FIG. 3A, movable aperture plate 373 may be moved to a first position between pre-beamlet-forming aperture array 372 and condenser lens 310. When movable aperture plate 373 is placed in the first position, an aperture of movable aperture plate 373 may be aligned with primary optical axis 304. Movable aperture plate 373 may be configured to block off off-axis beamlets (e.g., beamlets 312 and 313) and only allow on-axis beamlet (e.g., beamlet 311) to pass through during the single-beam mode. In some embodiments, movable aperture plate 373 may include a plurality of apertures with various sizes (as shown in FIG. 3C). In such embodiments, depending on the desired level of electric current of the beam, a different size aperture could be selected during the single-beam mode. For example, when a high current electron beam is desired, a bigger aperture may be used.

In the multi-beam mode, as shown in FIG. 3B, movable aperture plate 373 may be moved to a second position in which movable aperture plate 373 is sufficiently distanced away from the paths of primary electron beamlets 311, 312 and 313 such that primary electron beamlets 311, 312, and 313 would pass through.

Reference is now made to FIG. 3C, which is a schematic diagram of an embodiment of movable aperture plate 373 of FIGS. 3A and 3B, consistent with embodiments of the present disclosure. In some embodiments, movable aperture plate 373 may comprise one or more apertures. In some embodiments, movable aperture plate 373 may comprise multiple apertures with varying sizes to change the electric current of the primary electron beamlet while electron beam tool is operating in the single-beam mode. Although FIG. 3C shows a rectangular shape movable aperture plate, it is appreciated that movable aperture plate 373 may be in a different shape. For example, movable aperture plate 373 may be a circular plate with a plurality of apertures. The present disclosure does not limit the shape of movable aperture plate 373.

Figure 4A:
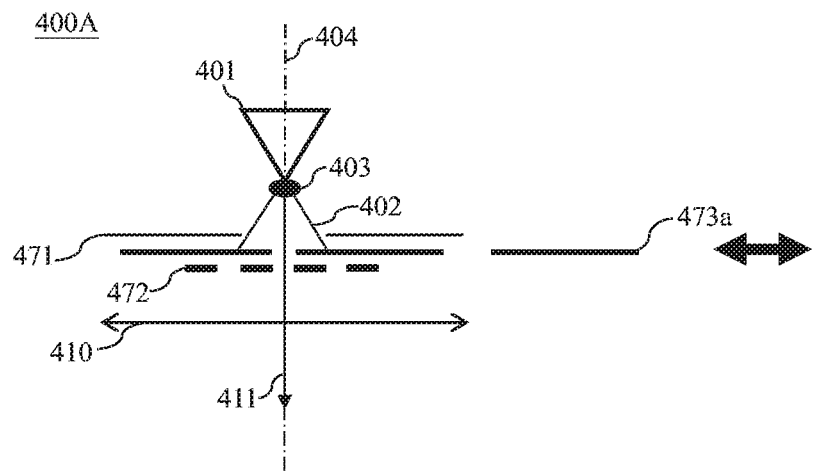
FIGS. 4A, and 4B are schematic diagrams of a multi-beam electron beam tool illustrating an exemplary configuration of a movable aperture plate, consistent with embodiments of the present disclosure.
Figure 4B:
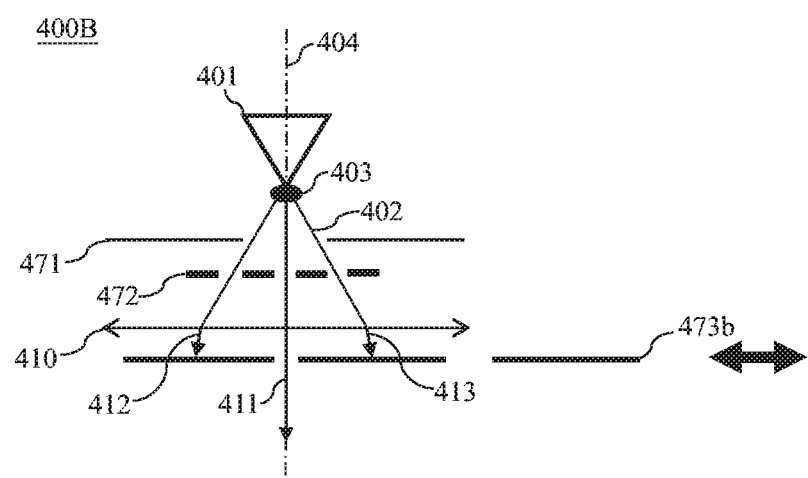

Reference is now made to FIGS. 4A and 4B, which are schematic diagrams of multi-beam electron beam tools 400A and 400B illustrating exemplary configurations of a movable aperture plate, consistent with embodiments of the present disclosure. Multi-beam electron beam tools 400A and 400B may be part of a multi-beam apparatus (such as multi-beam apparatus 40 of FIG. 2).

Similar to a configuration shown in FIGS. 3A and 3B, multi-beam electron beam tool 400A and 400B may include an electron source 401, a gun aperture plate 471, a pre-beamlet-forming aperture array 472, a condenser lens 410, and a movable aperture plate (e.g., 473a and 473b). FIGS. 4A and 4B, however, show embodiments of multi-beam electron beam tools having different configurations of a movable aperture plate. FIGS. 4A and 4B illustrate that the movable aperture plates may be moved to different positions for the single-beam mode relative to other structures aligned with a primary optical axis 404, such as gun aperture plate 471, pre-beamlet-forming aperture array 472, and condenser lens 410.

For example, movable aperture plate 473a of FIG. 4A may be positioned above pre-beamlet-forming aperture array 472 and below gun aperture plate 471 to enable the single-beam mode operation. In such embodiment, movable aperture plate 473a may trim off the off-axis portion of primary electron beam 402, thereby causing a single beamlet, e.g., electron beamlet 411, to be generated after pre-beamlet-forming aperture array 472.

On the other hand, movable aperture plate 473b of FIG. 4B may be positioned below condenser lens 410 to enable the single-beam mode operation by blocking off all off-axis beamlets (e.g., beamlets 412 and 413) and allowing only the on-axis beamlet (e.g., beamlet 411) to pass through during the single-beam mode.

Figure 5A:
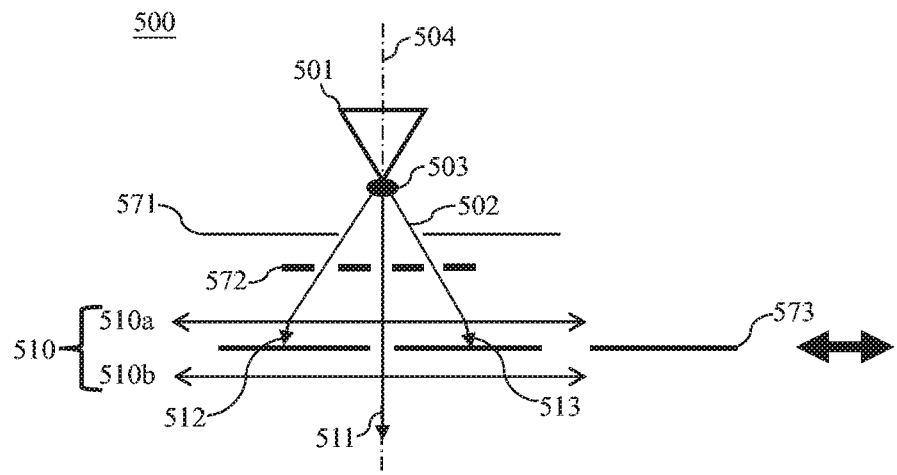
FIGS. 5A and 5B are schematic diagrams of a multi-beam electron beam tool illustrating an exemplary configuration of a movable aperture plate, consistent with embodiments of the present disclosure.
Figure 5B:
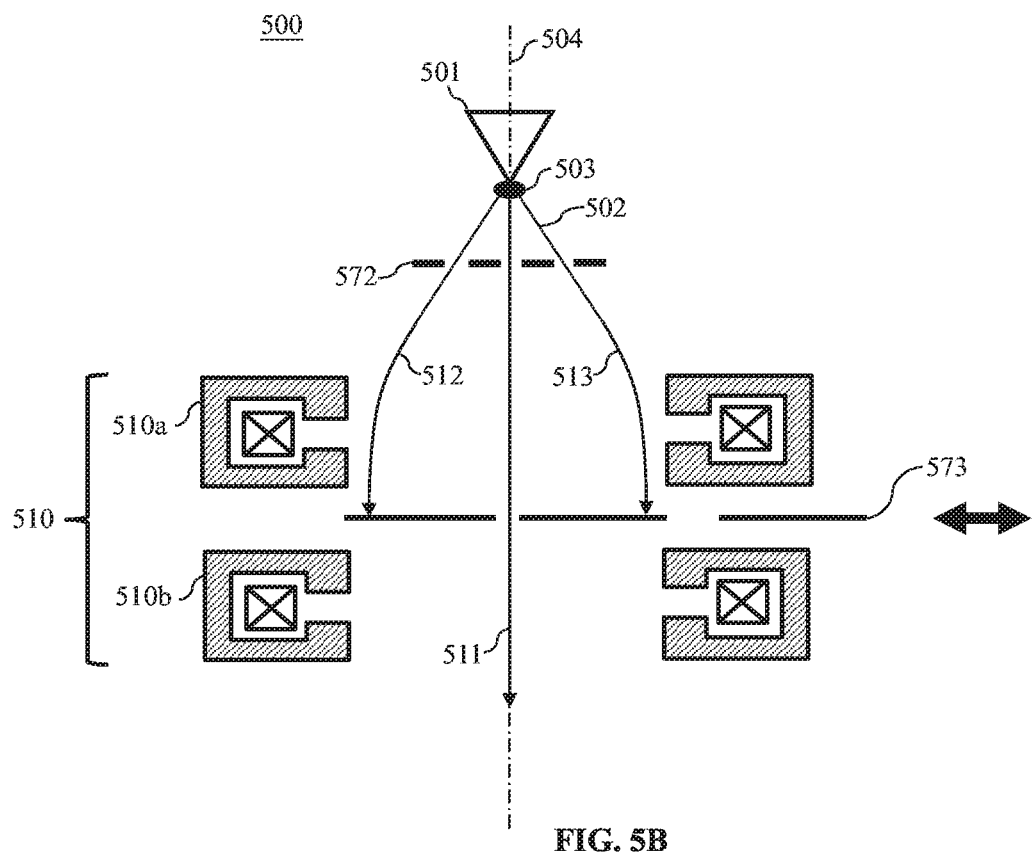

Reference is now made to FIGS. 5A and 5B, which are schematic diagrams of a multi-beam electron beam tool 500 illustrating exemplary configurations of a movable aperture plate 573, consistent with embodiments of the present disclosure. Multi-beam electron beam tool 500 may be part of a multi-beam apparatus (such as multi-beam apparatus 40 of FIG. 2).

Similar to the embodiments described earlier, a multi-beam electron beam tool 500 may include an electron source 501, a gun aperture plate 571, a pre-beamlet-forming aperture array 572, a condenser lens 510, and a movable aperture plate 573. FIGS. 5A and 5B show additional embodiments of a multi-beam electron beam tool with different configurations of a movable aperture plate. In some embodiments, condenser lens 510 may comprise two or more lenses that operate in combination to change the paths of primary electron beamlets. Those two or more lenses may be electrostatic lenses, magnetic lenses, or a combination of both. For example, FIG. 5A shows an embodiment of condenser lens 510 comprising two magnetic lenses 510a and 510b. In such embodiments, as shown in FIG. 5B, movable aperture plate 573 may be moved to a position in between two magnetic lenses 510a and 510b to block of off-axis electron beamlets 512, 513, thereby enabling the single-beam mode operation. It is appreciated that movable aperture plate 573 may be in a various shape. For example, movable aperture plate 573 may be a rectangular plate as shown in FIG. 3C. In some embodiments, movable aperture plate may be a circular plate with a plurality of apertures. In such embodiments, the circular aperture plate may rotate to enable a different size of aperture to be aligned with the optical axis to allow the electrons to pass through. This rotating circular aperture plate may be suitable for a tight space, such as within condenser lens 510.

Figure 6A:
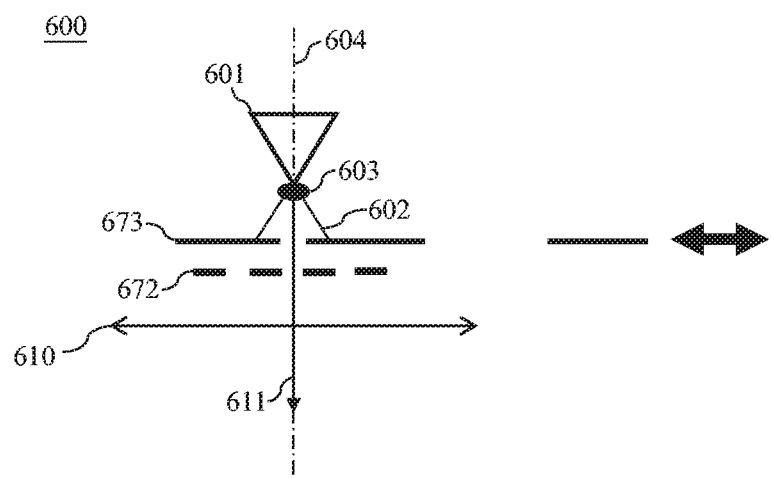
FIGS. 6A and 6B are schematic diagrams of a multi-beam electron beam tool illustrating an exemplary configuration of a movable aperture plate, consistent with embodiments of the present disclosure.
Figure 6B:
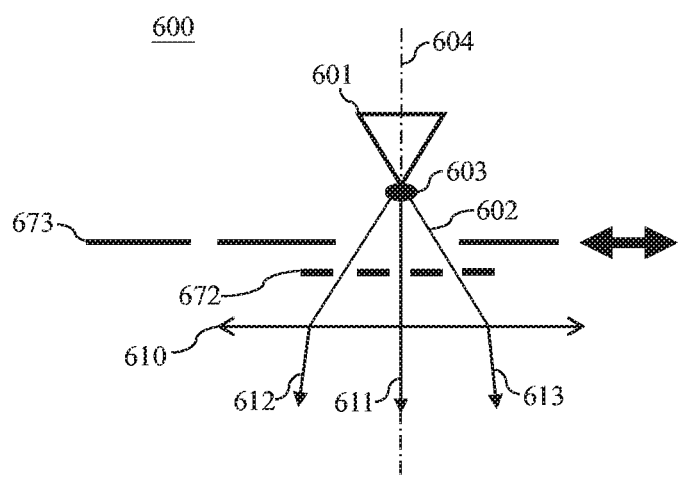
Figure 6C:
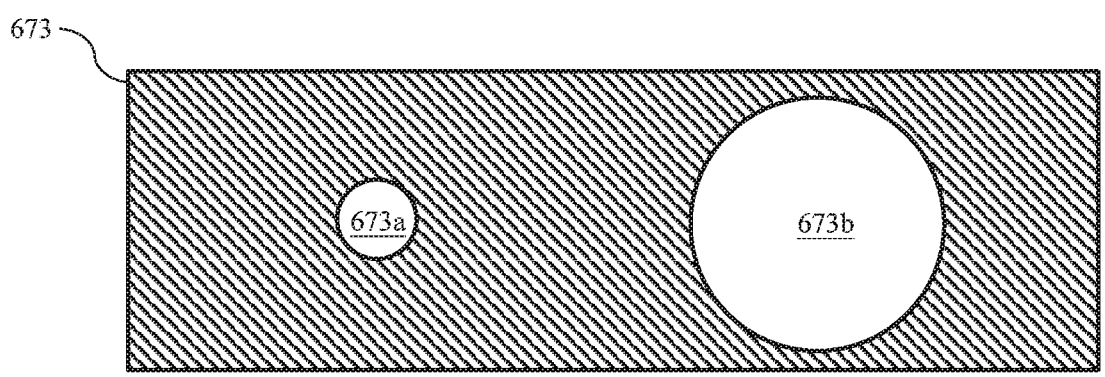
FIG. 6C is a schematic diagram of an embodiment of the movable aperture plate of FIGS. 6A and 6B, consistent with embodiments of the present disclosure.

Reference is now made to FIGS. 6A, 6B, and 6C, which are schematic diagrams of a multi-beam electron beam tool 600 illustrating exemplary configurations of a movable aperture plate 673, consistent with embodiments of the present disclosure. Multi-beam electron beam tool 600 may be part of a multi-beam apparatus (such as multi-beam apparatus 40 of FIG. 2).

Similar to the embodiments described earlier, a multi-beam electron beam tool 600 may include an electron source 601, a pre-beamlet-forming aperture array 672, a condenser lens 610, and a movable aperture plate 673. In some embodiments, as shown in FIGS. 6A and 6B, a gun aperture plate may be replaced with movable aperture plate 673 comprising two or more apertures thereon, wherein a first aperture (e.g., aperture 673a of FIG. 6C) is used in a single-beam mode and a second aperture (e.g., aperture 673b of FIG. 6C) is used in a multi-beam mode.

For example, in the single-beam mode, as shown in FIG. 6A, movable aperture plate 673 may be moved to a first position above pre-beamlet-forming aperture array 672. When movable aperture plate 673 is placed in the first position, the first aperture (e.g., aperture 673a of FIG. 6C) of movable aperture plate 673 is aligned with primary optical axis 604. The first aperture may comprise a small opening that is configured to trim off the off-axis potion of primary electron beam 602, thereby resulting in a single beamlet, e.g., electron beamlet 611, being generated after pre-beamlet-forming aperture array 672.

In the multi-beam mode, as shown in FIG. 6B, movable aperture plate 673 may be moved to a second position. When movable aperture plate 673 is placed in the second position, the second aperture (e.g., aperture 673b of FIG. 6C) of movable aperture plate 673 is aligned with primary optical axis 604. The second aperture may comprise a larger opening that is capable of passing a larger portion of primary electron beam 602, thereby resulting in multiple beamlets— on-axis beamlet (e.g., beamlet 611) as well as off-axis beamlets (e.g., beamlets 612 and 613)—being generated. In such embodiments, the second aperture effectively functions as a gun aperture array in the multi-beam mode (e.g., gun aperture array 371 of FIG. 3B) by passing through a sufficiently large portion of primary electron beam 602 to generate multiple beamlets while blocking off peripheral electrons of primary electron beam 602 to reduce Coulomb effect.

Although FIG. 6C shows a rectangular shape movable aperture plate, it is appreciated that movable aperture plate 673 may be in a different shape. For example, movable aperture plate 673 may be a circular plate with a plurality of apertures. The present disclosure does not limit the shape of movable aperture plate 373.

Figure 7A:
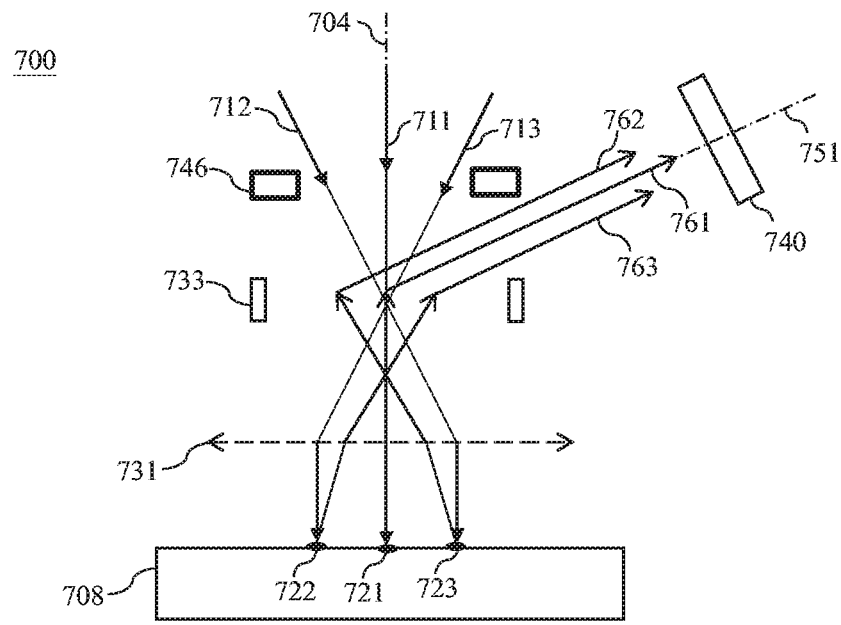
FIGS. 7A and 7B are schematic diagrams of a multi-beam electron beam tool illustrating an exemplary configuration of secondary electron detection devices, consistent with embodiments of the present disclosure.
Figure 7B:
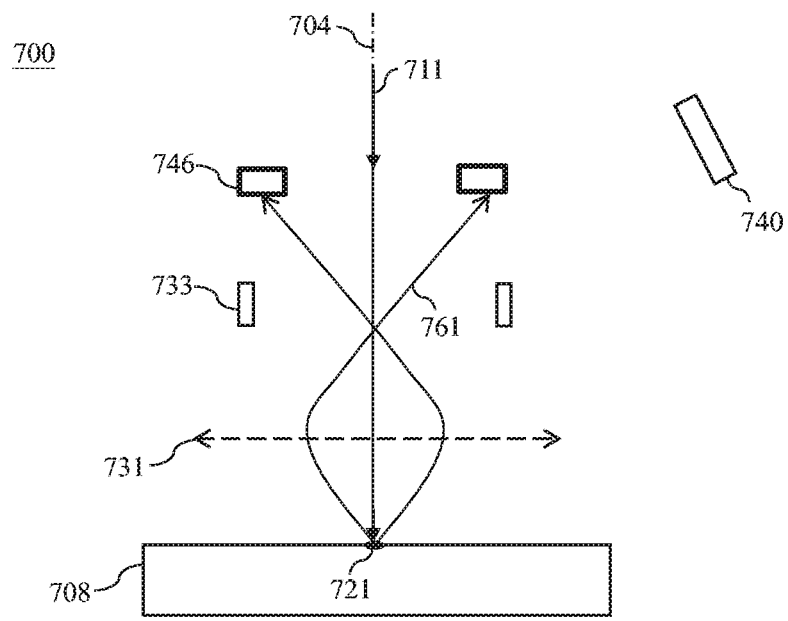

Reference is now made to FIGS. 7A and 7B, which are schematic diagrams of a multi-beam electron beam tool 700 illustrating an exemplary configuration of secondary electron detection devices 740 and 746, consistent with embodiments of the present disclosure. FIG. 7A illustrates a multi-beam mode of operation for multi-beam electron beam tool 700. FIG. 7B illustrates a single-beam mode of operation for multi-beam electron beam tool 700.

In some embodiments, multi-beam electron beam tool 700 may comprise an objective lens 731 configured to focus beamlets 711, 712, and 713 onto sample 708 for inspection and may form, three probe spots 721, 722, and 723 on the surface of sample 708. Multi-beam electron beam tool 700 may comprise a multi-beam detection device 740 and a single-beam detection device 746 that are configured to detect secondary electrons during the multi-beam mode and the single-beam mode, respectively. Multi-beam detection device 740 may be aligned with a secondary optical axis 751. Single-beam detection device 746 may be aligned with a primary optical axis 704.

Multi-beam electron beam tool 700 may also comprise a beam separator 733 configured to deflect secondary electrons in different directions based on the operation modes of multi-beam electron beam tool 700. For example, as shown in FIG. 7A, in the multi-beam mode, beam separator 733 may be configured to deflect secondary electron beams 761, 762, and 763 towards multi-beam detection device 740 along secondary optical axis 751. On the other hand, in the single-beam mode, as shown in FIG. 7B, beam separator 733 may be disabled so that secondary electron beam 761 can be detected by single-beam detection device 746, which may be specially designed to enhance the detection of secondary electrons generated by single-beam (e.g., primary beamlet 711).

Figure 8A:
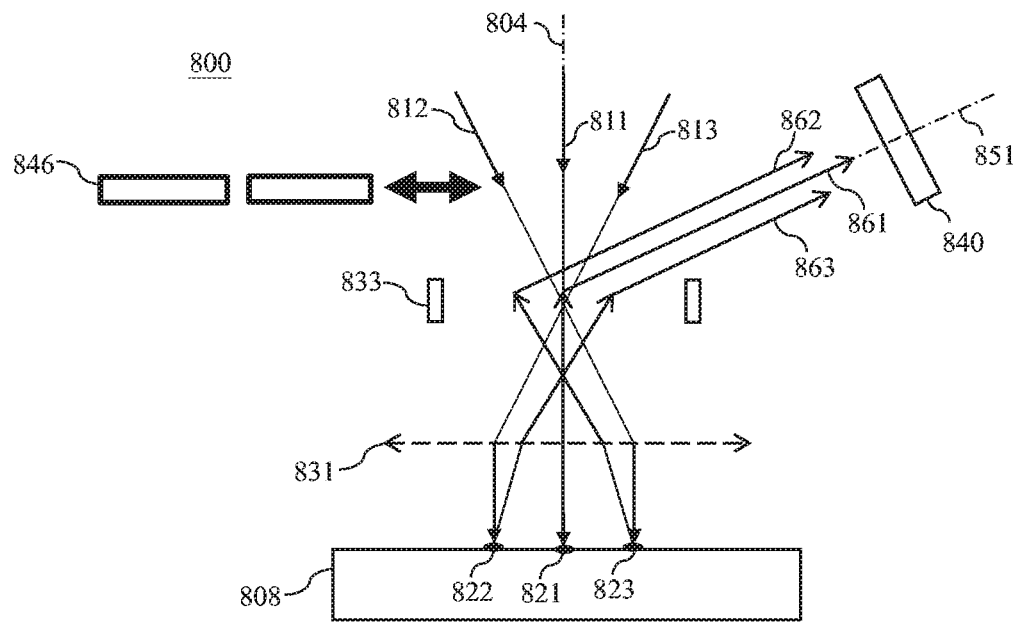
FIGS. 8A and 8B are schematic diagrams of a multi-beam electron beam tool illustrating an exemplary configuration of secondary electron detection devices, consistent with embodiments of the present disclosure.
Figure 8B:
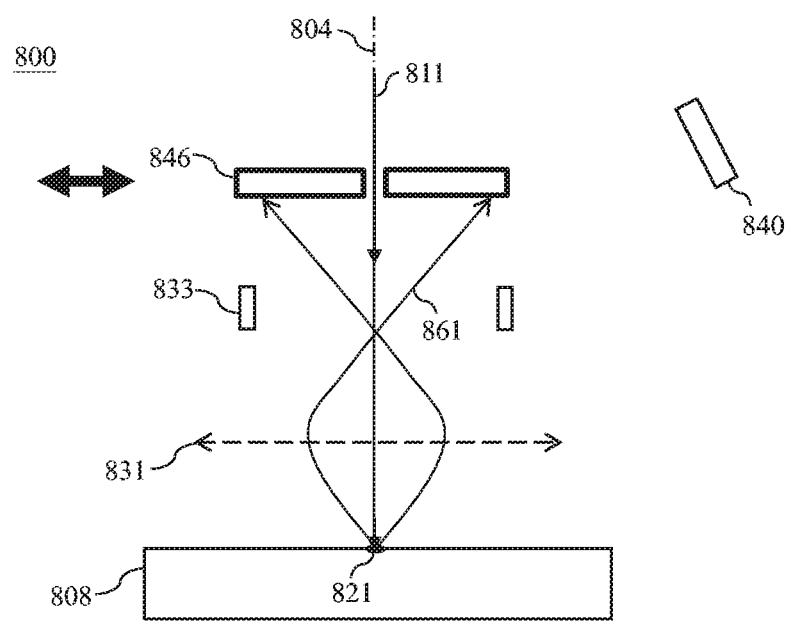

Reference is now made to FIGS. 8A and 8B, which are schematic diagrams of a multi-beam electron beam tool 800 illustrating an exemplary configuration of secondary electron detection devices 840 and 846, consistent with embodiments of the present disclosure. FIG. 8A illustrates a multi-beam mode of operation for multi-beam electron beam tool 800. FIG. 8B illustrates a single-beam mode of operation for multi-beam electron beam tool 800.

Multi-beam electron beam tool 800 may operate in a similar way described earlier with respect to FIGS. 7A and 7B. During a multi-beam mode, a beam separator 833 may be configured to deflect secondary electron beams 861, 862, and 863 towards a multi-beam detection device 840 along with secondary optical axis 851. During a single-beam mode, beam separator 833 may be configured to be disabled so that secondary electron beam 861 can be detected by a single-beam detection device 846, which may be specially designed to detect a single-beam secondary electron beam.

One notable difference of multi-beam electron beam tool 800 from multi-beam electron beam tool 700 of FIGS. 7A and 7B, however, is that, in some embodiments, single-beam detection device 846 may be movable. For example, during the multi-beam mode, as shown in FIG. 8A, single-beam detection device 846 may be moved away from primary optical axis 804 to create room for multiple beamlets (e.g., beamlets 811, 812, and 813) to pass through. During the single-beam mode, as shown in FIG. 8B, single-beam detection device 846 may be moved to a position aligned with primary optical axis 804 to detect secondary electron beam 861. Because single-beam detection device 846 moves away during the multi-beam mode, single-beam detection device 846 may be a larger than a fixed design (e.g., single-beam detection device 746 of FIG. 7A), allowing the ability to provide a higher resolution during the single-beam mode inspection.

Figure 9A:
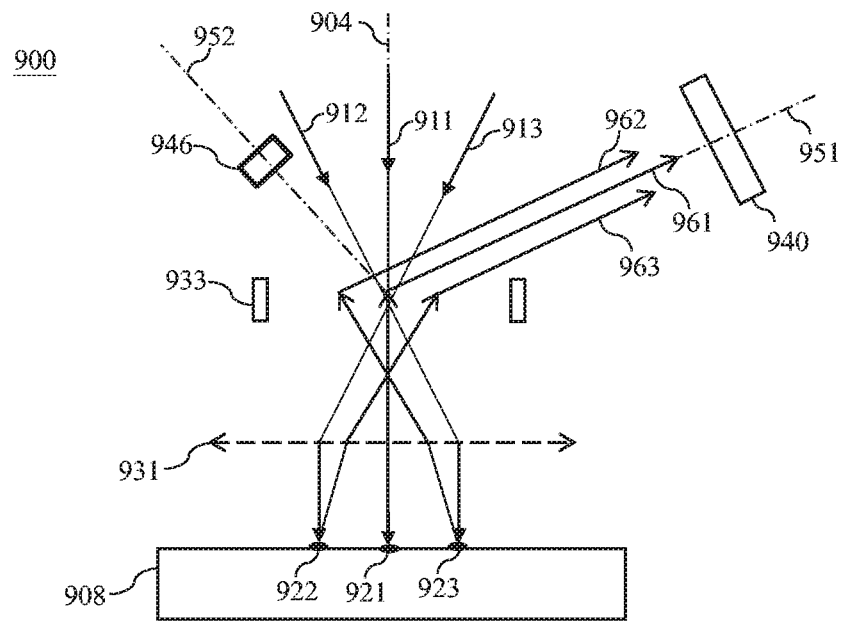
FIGS. 9A, 9B, and 9C are schematic diagrams of a multi-beam electron beam tool illustrating an exemplary configuration of secondary electron detection devices, consistent with embodiments of the present disclosure.
Figure 9B:
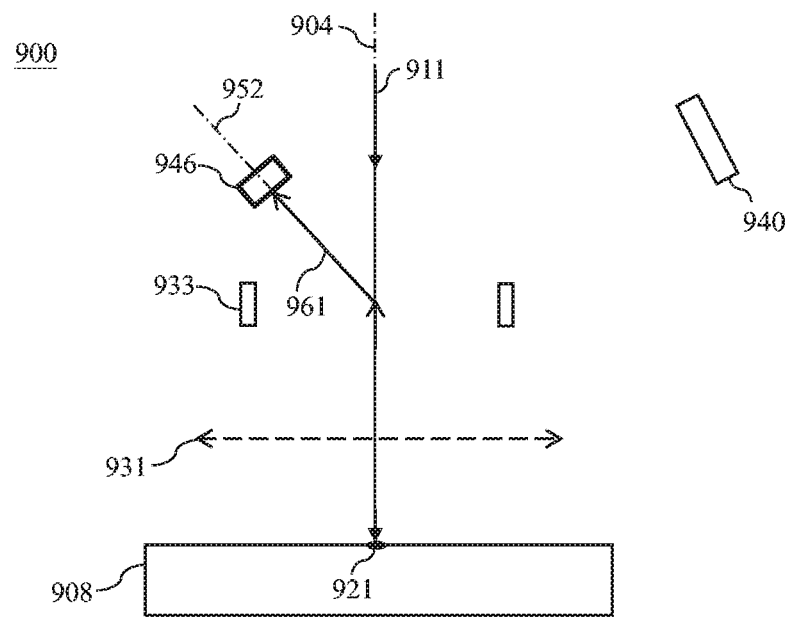
Figure 9C:
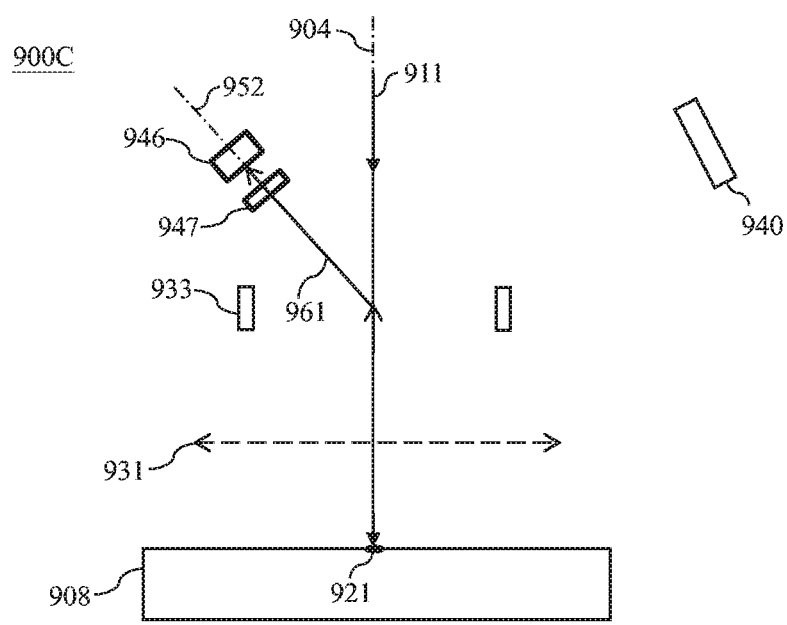

Reference is now made to FIGS. 9A, 9B, and 9C, which are schematic diagrams of a multi-beam electron beam tool 900 illustrating an exemplary configuration of secondary electron detection devices 940 and 946, consistent with embodiments of the present disclosure. Multi-beam electron beam tool 900 may be part of a multi-beam apparatus (such as multi-beam apparatus 40 of FIG. 2). FIG. 9A illustrates a multi-beam mode of operation for multi-beam electron beam tool 900. FIGS. 9B and 9C illustrate a single-beam mode of operation for multi-beam electron beam tool 900.

Multi-beam electron beam tool 900 may operate in a similar way described earlier with respect to FIGS. 7A and 7B. During a multi-beam mode, a beam separator 933 may be configured to deflect secondary electron beams 961, 962, and 963 towards a multi-beam detection device 940 along a first secondary optical axis 951.

One notable difference of multi-beam electron beam tool 900 from multi-beam electron beam tool 700 of FIGS. 7A and 7B, however, is that, in some embodiments, single-beam detection device 946 may not be aligned with primary optical axis 904. In such embodiments, during a single-beam mode, beam separator 933 may be configured to deflect secondary electron beam 961 towards single-beam detection device 946, which may be aligned with a second secondary optical axis 952, as shown in FIG. 9B. In some embodiments, first secondary optical axis 951 and second secondary optical axis 952 are symmetrical with respect to primary optical axis 904. It is, however, appreciated that optical axes 951 and 952 may not be symmetrical.

As shown in FIG. 9C, in some embodiments, multi-beam electron beam tool 900 may further comprise an energy filter 947 in front of single-beam detection device 946. Energy filter 947 may also be aligned with second secondary optical axis 952. Energy filter 947 may be configured to enhance detection of back-scattered electrons which typically have higher energy than normal secondary electrons. In some embodiments, energy filter 947 may selectively allow electrons with a certain energy level to pass through. For example, energy filter 947 may be tuned to pass through only high energy electrons, such as back-scattered electrons, to enable more back-scattered electrons to arrive at single-beam detection device 946 than normal secondary electrons.

Figure 10A:
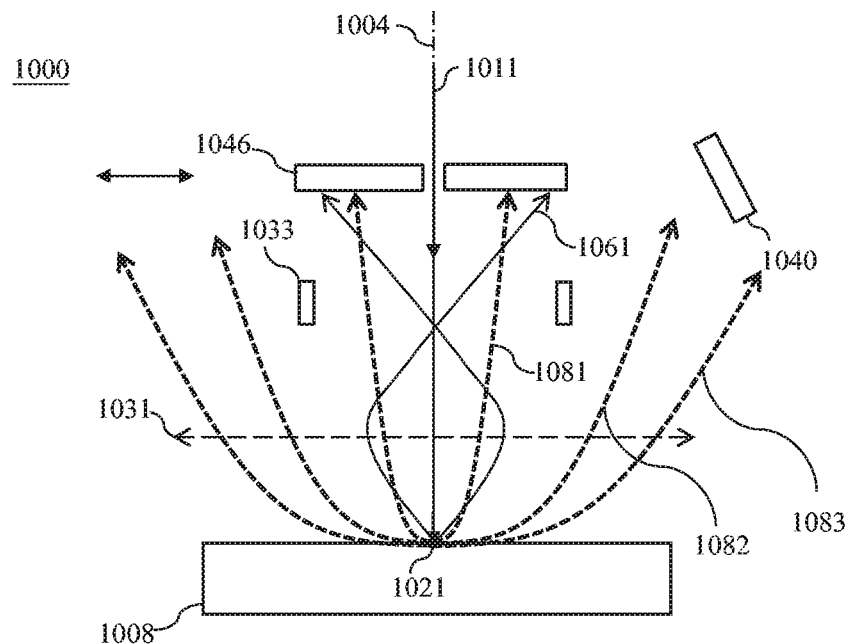
FIGS. 10A and 10B are schematic diagrams of a multi-beam electron beam tool illustrating an exemplary configuration of secondary electron detection devices, consistent with embodiments of the present disclosure.
Figure 10B:
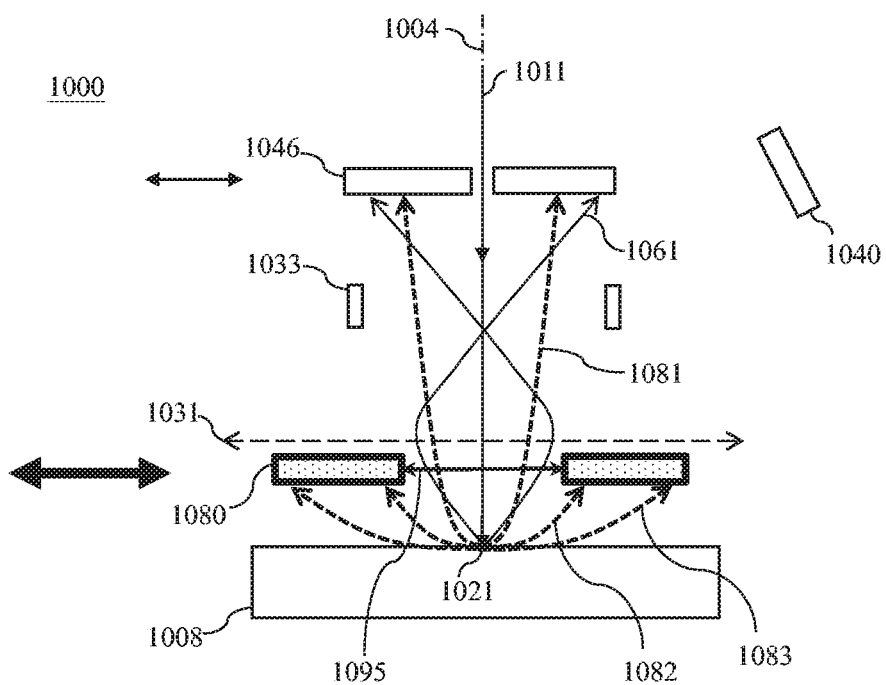

Reference is now made to FIGS. 10A and 10B, which are schematic diagrams of a multi-beam electron beam tool 1000 illustrating an exemplary configuration of secondary electron detection devices 1046 and 1080, consistent with embodiments of the present disclosure.

Multi-beam electron beam tool 1000 may operate in a similar way as multi-beam electron beam tool 700 or 800, which were described earlier with respect to FIGS. 7A/7B and 8A/8B, respectively. When multi-beam electron beam tool 1000 operates in a multi-beam mode, a beam separator 1033 may be configured to deflect secondary electron beam 1061 towards a multi-beam detection device 1040. When multi-beam electron beam tool 1000 operates in a single-beam mode, as shown in FIGS. 10A and 10B, beam separator 1033 may be configured to be disabled so that secondary electron beam 1061 can be detected by a single-beam detection device 1046, which may be specially designed to detect a single-beam secondary electron beam. In some embodiments, single-beam detection device 1046 is immovable similar to single-beam detection device 746 in FIGS. 7A and 7B. In some embodiments, single-beam detection device 1046 is movable similar to single-beam detection device 846 in FIGS. 8A and 8B.

In response to incidence of primary beamlet 1011 on sample 1008, a secondary electron beam may emerge from sample 1008. The secondary electron beam may comprise secondary electrons (such as 1061) and backscattered electrons (such as 1081, 1082 and 1083) as shown in FIGS. 10A and 10B. The secondary electrons 1061 have low emission energies and therefore are easily focused by objective lens 1031 to be detected by single-beam detection device 1046. The backscattered electrons have high emission energies and therefore are difficult to be focused by objective lens 1031. Accordingly, only those backscattered electrons with small emission angles (such as 1081) can be detected by single-beam detection device 1046.

But, as shown in FIG. 10A, those backscattered electrons with large emission angles, such as 1082 and 1083, cannot be focused sufficiently and may not be detected by single-beam detection device 1046 during the single-beam mode. In some embodiments, capturing those backscattered electrons with large emission angles (e.g., beams 1082 and 1083) may be useful for defect inspection because those backscattered electrons may include topographic and material information about sample 1008.

As shown in FIG. 10B, an additional single-beam detection device 1080 can be used, in some embodiments, to capture those backscattered electrons with large emission angles. The additional single-beam detection device 1080 may be placed between an objective lens 1031 and sample 1008.

In some embodiments, the additional single-beam detection device 1080 may be immovable similar to single-beam detection device 746 in FIGS. 7A and 7B. In such embodiments, the additional single-beam detection device 1080 may be designed to have sufficiently large inner hole diameter 1095 to avoid blocking primary electron beams (e.g., beamlets 811, 812, 813 in FIG. 8A) and secondary electron beams (e.g., secondary beams 861, 862, 863) when multi-beam electron beam tool 1000 is operating in the multi-beam mode.

In some embodiments, the additional single-beam detection device 1080 may be movable similar to single-beam detection device 846 in FIGS. 8A and 8B. For example, during the multi-beam mode, the additional single-beam detection device 1080 may be moved away from primary optical axis 1004 to create room for multiple beamlets to pass through. During the single-beam mode, as shown in FIG. 10B, the additional single-beam detection device 1080 may be moved to a position aligned with primary optical axis 1004 to detect backscattered electrons with large emission angles, such as backscattered electrons 1082 and 1083.

Because the additional single-beam detection device 1080 moves away during the multi-beam mode, the additional single-beam detection device 1080 may be optimized for collecting backscattered electrons when operating in the single-beam mode. For example, inner hole diameter 1095 of the additional single-beam detection device 1080 may be smaller than the fixed-design, resulting in bigger detection area. This optimization may provide the ability to capture more backscattered electrons that could result in higher imaging resolution and higher inspection throughput of sample 1008 during the single-beam mode inspection.

In some embodiments, capturing secondary electrons and backscattered electrons in terms of emission angles may be more helpful for defect inspection because this information is related pattern orientation on sample surface or inside sample. Therefore single-beam detection device 1046 and additional single-beam detection device 1080 may comprise multiple detection areas or be segmented as shown in FIGS. 10C, 10D, and 10E.

Figure 10C:
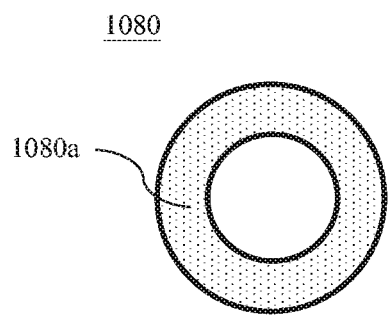
FIGS. 10C, 10D, and 10E are schematic diagrams of embodiments of the secondary electron detection device of FIG. 10B, consistent with embodiments of the present disclosure.
Figure 10D:
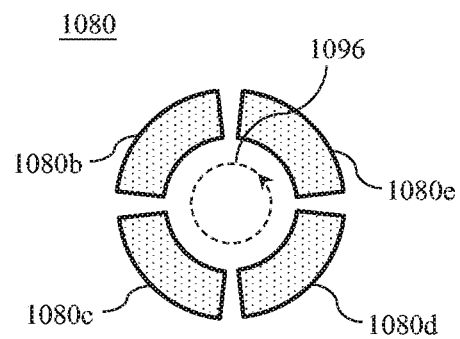
Figure 10E:
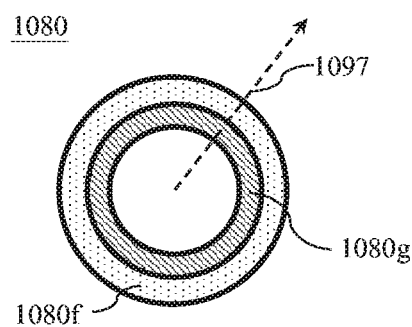

Reference is now made to FIGS. 10C, 10D, and 10E, which illustrate schematic diagrams of exemplary embodiments of the additional single-beam detection device 1080 of FIG. 10B, consistent with embodiments of the present disclosure. In some embodiments, the additional single-beam detection device 1080 may comprise a single ring-shape detection area 1080a, as shown in FIG. 10C.

Backscattered electrons emitted from the sample (e.g., sample 1008 of FIG. 10B) may provide different information depending on the shape and orientation of the features implemented within the sample. Accordingly, in some embodiments, the additional secondary electron detection device 1080 may comprise multiple segments of detection area so that more specific information related to the features on the sample can be obtained.

FIG. 10D illustrates an example of the additional single-beam detection device 1080. In some embodiments, the additional single-beam detection device 1080 may comprise detection segments 1080b, 1080c, 1080d, and 1080e that are located along a rotational direction 1096. This enables detecting backscattered electrons in terms of emission azimuth angles (emission angle in circumferential direction) thereof and is helpful for defect inspection of some types of samples.

FIG. 10E illustrates another example of the additional single-beam detection device 1080. In some embodiments, the additional single-beam detection device 1080 may comprise detection segments 1080f and 1080g that are located along a radial direction 1097. This enables detecting backscattered electrons in terms of emission radial angles (emission angle with respect to surface normal) thereof and is helpful for defect inspection of some types of samples.

In some embodiments, single-beam detection device 1046 of FIGS. 10A and 10B may comprise a single ring-shape detection area (e.g., the single ring-shape detection area 1080a shown in FIG. 10) or a plurality of detection segments (e.g., rotationally arranged detection segments 1080b-1080e in FIG. 10D or radially arranged detection segments 1080f-1080g in FIG. 10E).

Figure 11:
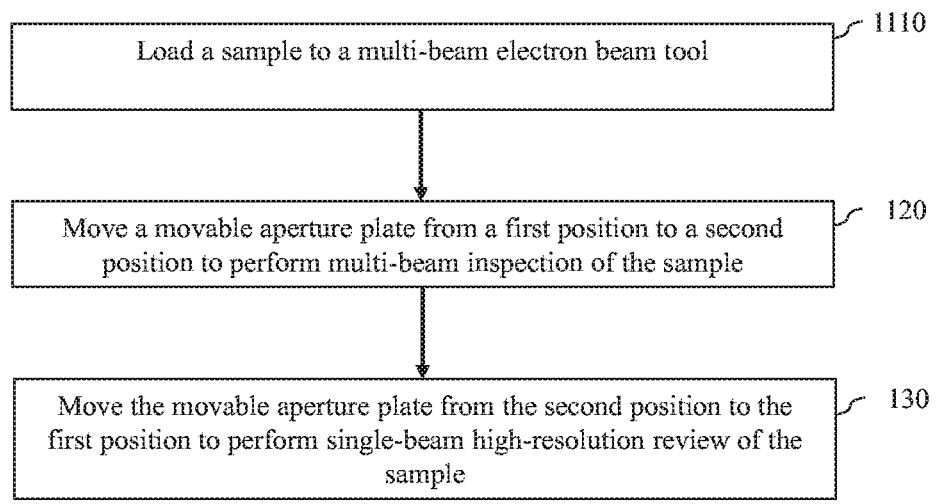
FIG. 11 is a flow chart illustrating an exemplary method of inspecting a sample using a multi-beam electron beam tool, consistent with embodiments of the present disclosure.

Reference is now made to FIG. 11, which is a flow chart illustrating an exemplary method of inspecting a sample using a multi-beam electron beam tool (such as multi-beam electron beam tool 300 of FIG. 3A), consistent with embodiments of the present disclosure. In some embodiments, the multi-beam electron beam tool may include an electron source (e.g., electron source 301 of FIG. 3A), a gun aperture plate (e.g., gun aperture plate 371 of FIG. 3A), a pre-beamlet-forming aperture array (e.g., pre-beamlet-forming aperture array 372), and a condenser lens (e.g., condenser lens 310 of FIG. 3A). The electron source is configured to emit primary electrons and form a primary electron beam (e.g., primary electron beam 302 of FIG. 3A). The gun aperture plate is configured to block off peripheral electrons of the primary electron beam to reduce the Coulomb effect, which may deteriorate inspection resolution. In some embodiments, the pre-beamlet-forming aperture array further cuts the peripheral electrons of the primary electron beam to reduce the Coulomb effect. The primary-electron beam may be trimmed into a plurality of primary electron beamlets (e.g., electron beamlets 311, 312 and 313 in FIG. 3A) after passing the pre-beamlet-forming aperture array.

In some embodiments, the multi-beam electron beam tool may further include a movable aperture plate (e.g., movable aperture plate 373 of FIGS. 3A and 3B) that may be used to support multiple operation modes of the electron beam tool, such as a single-beam mode and a multi-beam mode. In some embodiments, the multi-beam electron beam tool may also include a controller having circuitry and configured to changed configuration of the multi-beam electron beam tool to switch between the multi-beam mode and the single-beam mode.

In step 1110, the sample is loaded to the multi-beam electron beam tool for inspection. In step 1120, when the multi-beam electron beam tool is placed into the multi-beam mode inspection, the controller enables the movable aperture plate to be moved from a first position to a second position to perform multi-beam inspection of the sample. In some embodiments, in multi-beam mode, the movable aperture plate may be positioned in the second position in which the movable aperture plate is sufficiently distanced away from the paths of the plurality of primary electron beamlets so that those primary beamlets would pass through.

In step 1130, when the multi-beam electron beam tool is placed into the single-beam mode, the controller enables the movable aperture plate to be moved from the second position to a first position to perform high-resolution single-beam inspection of the sample. In some embodiments, when the movable aperture plate is placed in the first position, an aperture of the movable aperture plate may be aligned with the primary optical axis. The movable aperture plate may be configured to block off off-axis primary electron beamlets (e.g., beamlets 312 and 313 of FIG. 3A) and only allow an on-axis beamlet (e.g., beamlet 311 of FIG. 3A) to pass through during the single-beam mode.

The embodiments may further be described using the following clauses:

1. A charged particle beam apparatus for inspecting a sample supporting a plurality of operation modes, comprising:
    a charged particle beam source configured to emit a charged particle beam along a primary optical axis;
    a first aperture plate configured to form a plurality of charged particle beamlets from the charged particle beam;
    a second aperture plate, movable between a first position and a second position; and
    a controller having circuitry and configured to change the configuration of the apparatus to switch between a first mode and a second mode, wherein:
        in the first mode:
            the second aperture plate is positioned in the first position, and
            the first aperture plate and the second aperture plate are configured to allow a first charged particle beamlet of the plurality of charged particle beamlets to pass through, and
        in the second mode:
            the second aperture plate is positioned in the second position, and
            the first aperture plate and the second aperture plate are configured to allow the first charged particle beamlet and a second charged particle beamlet of the plurality of charged particle beamlets to pass through.

2. The apparatus of clause 1, wherein the first mode is a single-beam mode and the second mode is a multi-beam mode.

3. The apparatus of any one of clauses 1-2, wherein the first charged particle beamlet is an on-axis beamlet with respect to the primary optical axis, and the second charged particle beamlet is an off-axis beamlet with respect to the primary optical axis.

4. The apparatus of any one of clauses 1-3, wherein the second aperture plate is configured to block the second charged particle beamlet when the apparatus operates in the first mode.

5. The apparatus of any one of clauses 1-4, wherein the first aperture plate is positioned between the charged particle beam source and the second aperture plate when the apparatus operates in the first mode.

6. The apparatus of any one of clauses 1-5, further comprising:
    a condenser lens configured to change paths of the plurality of charged particle beamlets to form a plurality of images of the charged particle beam source on an image plane.

7. The apparatus of clause 6, wherein the second aperture plate is positioned between the first aperture plate and the condenser lens when the apparatus operates in the first mode.

8. The apparatus of clause 6, wherein the condenser lens is positioned between the first aperture plate and the second aperture plate when the apparatus operates in the first mode.

9. The apparatus of clause 6, wherein the condenser lens includes a first deflector and a second deflector, and wherein the second aperture plate is positioned between the first deflector and the second deflector when the apparatus operates in the first mode.

10. The apparatus of any one of clauses 1-4, wherein the second aperture plate is positioned between the charged particle beam source and the first aperture plate when the apparatus operates in the first mode.

11. The apparatus of any one of clauses 1-10, further comprising:
    a beam separator configured to deflect secondary electrons generated from the sample; and
    a first electron detection device configured to detect the secondary electrons when the apparatus operates either in the first mode or in the second mode.

12. The apparatus of clause 11, wherein the controller includes circuitry to:
    control the beam separator, either in the first mode or in the second mode, to deflect the secondary electrons towards the first electron detection device, wherein the first electron detection device is aligned with a first secondary optical axis.

13. The apparatus of any one of clauses 1-10, further comprising:
    a beam separator configured to deflect secondary electrons generated from the sample;
    a first electron detection device configured to detect the secondary electrons when the apparatus operates in the second mode; and
    a second electron detection device configured to detect the secondary electrons when the apparatus operates in the first mode.

14. The apparatus of clause 13, wherein the controller includes circuitry to:
    control the beam separator, in the second mode, to deflect the secondary electrons towards the first electron detection device, wherein the first electron detection device is aligned with a first secondary optical axis, and
    disable the beam separator, in the first mode, to allow the secondary electrons to travel towards the second electron detection device.

15. The apparatus of clause 14, wherein the second electron detection device is aligned with the primary optical axis.

16. The apparatus of clause 14, wherein the second electron detection device is movable between a third position and a fourth position, wherein:
    if the apparatus is configured to be in the first mode, the second electron detection device is positioned at the third position, in which the second electron detection device is aligned with the primary optical axis, to detect the secondary electrons, and
    if the apparatus is configured to be in the second mode, the second electron detection device is positioned at the fourth position, in which the second electron detection device is positioned away from the primary optical axis.

17. The apparatus of clause 13, wherein the controller includes circuitry to:
    control the beam separator to deflect the secondary electrons towards the first electron detection device during the second mode, wherein the first electron detection device is aligned with a first secondary optical axis, and
    control the beam separator to deflect the secondary electrons towards the second electron detection device during the first mode, wherein the second electron detection device is aligned with a second secondary optical axis.

18. The apparatus of clause 17, wherein the first secondary optical axis and the second secondary optical axis are symmetrical with respect to the primary optical axis.

19. The apparatus of any one of clauses 17 and 18, wherein the second electron detection device includes an electron detector to detect the secondary electrons and an energy filter in front of the electron detector to enhance backscattered electron detections.

20. The apparatus of any one of clauses 1-10, further comprising:
a beam separator configured to deflect secondary electrons generated from the sample;
a first electron detection device configured to detect the secondary electrons when the apparatus operates in the second mode;
a second electron detection device configured to detect a first portion of the secondary electrons when the apparatus operates in the first mode; and
a third electron detection device configured to detect a second portion of the secondary electrons when the apparatus operates in the first mode.

21. The apparatus of clause 20, wherein the second portion of the secondary electrons comprises electrons with higher energy than electrons of the first portion of the secondary electrons.

22. The apparatus of clause 20, wherein the second portion of the secondary electrons comprises electrons with larger emission angles than electrons of the first portion of the secondary electrons.

23. The apparatus of any one of clauses 20-22, wherein the second portion of the secondary electrons comprises backscattered electrons emitted from the sample.

24. The apparatus of any one of clauses 20-23, wherein the second electron detection device and the third electron detection device are aligned with the primary optical axis.

25. The apparatus of any one of clauses 20-23, wherein:
the third electron detection device is aligned with the primary optical axis to detect the second portion of the secondary electrons, and
the second electron detection device is movable between a third position and a fourth position, wherein:
if the apparatus is configured to be in the first mode, the second electron detection device is positioned at the third position, in which the second electron detection device is aligned with the primary optical axis, to detect the first portion of the secondary electrons, and
if the apparatus is configured to be in the second mode, the second electron detection device is positioned at the fourth position, in which the second electron detection device is positioned away from the primary optical axis.

26. The apparatus of any one of clauses 20-23, wherein:
the second electron detection device is aligned with the primary optical axis to detect the first portion of the secondary electrons, and
the third electron detection device is movable between a fifth position and a sixth position, wherein:
if the apparatus is configured to be in the first mode, the third electron detection device is positioned at the fifth position, in which the third electron detection device is aligned with the primary optical axis, to detect the second portion of the secondary electrons, and
if the apparatus is configured to be in the second mode, the third electron detection device is positioned at the sixth position, in which the third electron detection device is positioned away from the primary optical axis.

27. The apparatus of any one of clauses 20-23, wherein:
the second electron detection device is movable between a third position and a fourth position, and
the third electron detection device is movable between a fifth position and a sixth position, wherein:
if the apparatus is configured to be in the first mode, the second electron detection device is positioned at the third position, in which the second electron detection device is aligned with the primary optical axis, to detect the first portion of the secondary electrons, and the third electron detection device is positioned at the fifth position, in which the third electron detection device is aligned with the primary optical axis, to detect the second portion of the secondary electrons, and
if the apparatus is configured to be in the second mode, the second electron detection device is positioned at the fourth position and the third electron detection device is positioned at the sixth position, in which the second and third electron detection devices are positioned away from the primary optical axis.

28. The apparatus of any one of clauses 20-27, wherein the second electron detection device comprises a plurality of detection segments, the third electron detection device comprises a plurality of detection segments, or the second and third electron detection device comprise a plurality of detection segments.

29. The apparatus of any one of clauses 1-28, wherein the second aperture plate includes a first aperture, wherein:
if the apparatus is configured to be in the first mode, the second aperture plate is positioned in the first position so that the first aperture is aligned with the primary optical axis, and
if the apparatus is configured to be in the second mode, the second aperture plate is positioned in the second position so that the first aperture is positioned away from the primary optical axis.

30. The apparatus of clause 29, wherein the second aperture plate further includes a second aperture larger than the first aperture, wherein:
if the apparatus is configured to be in a third mode, the second aperture is positioned in a fifth position so that the second aperture is aligned with the primary optical axis to block the second charged particle beamlet and to produce higher current probe spot on the sample than with the first aperture.

31. The apparatus of any one of clauses 1-28, wherein the second aperture plate includes a first aperture and a second aperture, wherein:
if the apparatus is configured to be in the first mode, the second aperture plate is positioned in the first position so that the first aperture is aligned with the primary optical axis, and
if the apparatus is configured to be in the second mode, the second aperture plate is positioned in the second position so that the second aperture is aligned with the primary optical axis.

32. The apparatus of clause 31, wherein the second aperture is larger than the first aperture.

33. The apparatus of any one of clauses 1-32, wherein the second aperture plate is a circular-shaped plate.

34. The apparatus of clause 33, wherein the second aperture plate rotates around the primary optical axis.

35. A method of inspecting a sample using a charged particle beam apparatus including a first aperture plate configured to form a plurality of charged particle beamlets from a charged particle beam emitted by a charged particle beam source, the method comprising:

moving a second aperture plate from a second position to a first position, wherein:

positioning of the second aperture plate at the first position enables a single charged particle beamlet of the charged particle beam to pass through the combination of the first and second aperture plates, and positioning of the second aperture plate at the second position enables a plurality of charged particle beamlets of the charged particle beam to pass through the combination of the first and second aperture plates.

36. The method of clause 35, further comprising:

moving a second aperture plate from the first position to the second position.

37. The method of any one of clauses 35 and 36, wherein the single charged particle beamlet is an on-axis charged particle beamlet with respect to a primary optical axis.

38. The method of any one of clauses 35-37, wherein the second aperture plate is configured to block an off-axis charged particle beamlet when positioned in the first position.

39. A charged particle beam apparatus for inspecting a sample supporting a plurality of operation modes, comprising:

a charged particle beam source configured to emit a charged particle beam along a primary optical axis;

a movable aperture plate, movable between a first position and a second position; and a controller having circuitry and configured to change the configuration of the apparatus to switch between a first mode and a second mode, wherein:

in the first mode:

the movable aperture plate is positioned in the first position and is configured to allow a first charged particle beamlet of a plurality of charged particle beamlets derived from the charged particle beam to pass through, and in the second mode:

the movable aperture plate is positioned in the second position and is configured to allow the first charged particle beamlet and a second charged particle beamlet of the plurality of charged particle beamlets to pass through.

40. The apparatus of clause 39, wherein the first mode is a single-beam mode and the second mode is a multi-beam mode.

41. The apparatus of any one of clauses 39-40, wherein the first charged particle beamlet is an on-axis beamlet with respect to the primary optical axis, and the second charged particle beamlet is an off-axis beamlet with respect to the primary optical axis.

42. The apparatus of any one of clauses 39-41, wherein the movable aperture plate is configured to block the second charged particle beamlet when the apparatus operates in the first mode.

43. The apparatus of any one of clauses 39-42, further comprising a pre-beamlet-forming aperture plate, wherein the pre-beamlet-forming aperture plate is positioned between the charged particle beam source and the movable aperture plate when the apparatus operates in the first mode.

44. The apparatus of any one of clauses 39-43, further comprising:

a condenser lens configured to change paths of the plurality of charged particle beamlets to form a plurality of images of the charged particle beam source on an image plane.

45. The apparatus of clause 44, wherein the movable aperture plate is positioned between the pre-beamlet-forming aperture plate and the condenser lens when the apparatus operates in the first mode.

46. The apparatus of clause 44, wherein the condenser lens is positioned between the pre-beamlet-forming aperture plate and the movable aperture plate when the apparatus operates in the first mode.

47. The apparatus of clause 44, wherein the condenser lens includes a first deflector and a second deflector, and wherein the movable aperture plate is positioned between the first deflector and the second deflector when the apparatus operates in the first mode.

48. The apparatus of any one of clauses 39-42, further comprising a pre-beamlet-forming aperture plate, wherein the movable aperture plate is positioned between the charged particle beam source and the pre-beamlet-forming aperture plate when the apparatus operates in the first mode.

49. The apparatus of any one of clauses 39-48, further comprising:

a beam separator configured to deflect secondary electrons generated from the sample; and a first electron detection device configured to detect the secondary electrons when the apparatus operates either in the first mode or in the second mode.

50. The apparatus of clause 49, wherein the controller includes circuitry to:

control the beam separator, either in the first mode or in the second mode, to deflect the secondary electrons towards the first electron detection device, wherein the first electron detection device is aligned with a first secondary optical axis.

51. The apparatus of any one of clauses 39-48, further comprising:

a beam separator configured to deflect secondary electrons generated from the sample;

a first electron detection device configured to detect the secondary electrons when the apparatus operates in the second mode; and a second electron detection device configured to detect the secondary electrons when the apparatus operates in the first mode.

52. The apparatus of clause 51, wherein the controller includes circuitry to:

control the beam separator, in the second mode, to deflect the secondary electrons towards the first electron detection device, wherein the first electron detection device is aligned with a first secondary optical axis, and disable the beam separator, in the first mode, to allow the secondary electrons to travel towards the second electron detection device.

53. The apparatus of clause 52, wherein the second electron detection device is aligned with the primary optical axis.

54. The apparatus of clause 52, wherein the second electron detection device is movable between a third position and a fourth position, wherein:

if the apparatus is configured to be in the first mode, the second electron detection device is positioned at the third position, in which the second electron detection device is aligned with the primary optical axis, to detect the secondary electrons, and if the apparatus is configured to be in the second mode, the second electron detection device is positioned at the fourth position, in which the second electron detection device is positioned away from the primary optical axis.

55. The apparatus of clause 51, wherein the controller includes circuitry to:
control the beam separator to deflect the secondary electrons towards the first electron detection device during the second mode, wherein the first electron detection device is aligned with a first secondary optical axis, and
control the beam separator to deflect the secondary electrons towards the second electron detection device during the first mode, wherein the second electron detection device is aligned with a second secondary optical axis.

56. The apparatus of clause 55, wherein the first secondary optical axis and the second secondary optical axis are symmetrical with respect to the primary optical axis.

57. The apparatus of any one of clauses 55 and 56, wherein the second electron detection device includes an electron detector to detect the secondary electrons and an energy filter in front of the electron detector to enhance backscattered electron detections.

58. The apparatus of any one of clauses 39-48, further comprising:
a beam separator configured to deflect secondary electrons generated from the sample;
a first electron detection device configured to detect the secondary electrons when the apparatus operates in the second mode;
a second electron detection device configured to detect a first portion of the secondary electrons when the apparatus operates in the first mode; and
a third electron detection device configured to detect a second portion of the secondary electrons when the apparatus operates in the first mode.

59. The apparatus of clause 58, wherein the second portion of the secondary electrons comprises electrons with higher energy than electrons of the first portion of the secondary electrons.

60. The apparatus of clause 58, wherein the second portion of the secondary electrons comprises electrons with larger emission angles than electrons of the first portion of the secondary electrons.

61. The apparatus of any one of clauses 58-60, wherein the second portion of the secondary electrons comprises backscattered electrons emitted from the sample.

62. The apparatus of any one of clauses 58-61, wherein the second electron detection device and the third electron detection device are aligned with the primary optical axis.

63. The apparatus of any one of clauses 58-62, wherein:
the third electron detection device is aligned with the primary optical axis to detect the second portion of the secondary electrons, and
the second electron detection device is movable between a third position and a fourth position, wherein:
if the apparatus is configured to be in the first mode, the second electron detection device is positioned at the third position, in which the second electron detection device is aligned with the primary optical axis, to detect the first portion of the secondary electrons, and
if the apparatus is configured to be in the second mode, the second electron detection device is positioned at the fourth position, in which the second electron detection device is positioned away from the primary optical axis.

64. The apparatus of any one of clauses 58-62, wherein:
the second electron detection device is aligned with the primary optical axis to detect the first portion of the secondary electrons, and
the third electron detection device is movable between a fifth position and a sixth position, wherein:
if the apparatus is configured to be in the first mode, the third electron detection device is positioned at the fifth position, in which the third electron detection device is aligned with the primary optical axis, to detect the second portion of the secondary electrons, and
if the apparatus is configured to be in the second mode, the third electron detection device is positioned at the sixth position, in which the third electron detection device is positioned away from the primary optical axis.

65. The apparatus of any one of clauses 58-62, wherein:
the second electron detection device is movable between a third position and a fourth position, and
the third electron detection device is movable between a fifth position and a sixth position, wherein:
if the apparatus is configured to be in the first mode, the second electron detection device is positioned at the third position, in which the second electron detection device is aligned with the primary optical axis, to detect the first portion of the secondary electrons, and the third electron detection device is positioned at the fifth position, in which the third electron detection device is aligned with the primary optical axis, to detect the second portion of the secondary electrons, and
if the apparatus is configured to be in the second mode, the second electron detection device is positioned at the fourth position and the third electron detection device is positioned at the sixth position, in which the second and third electron detection devices are positioned away from the primary optical axis.

66. The apparatus of any one of clauses 58-65, wherein the second electron detection device comprises a plurality of detection segments, the third electron detection device comprises a plurality of detection segments, or the second and third electron detection device comprise a plurality of detection segments.

67. The apparatus of any one of clauses 39-66, wherein the movable aperture plate includes a first aperture, wherein:
if the apparatus is configured to be in the first mode, the movable aperture plate is positioned in the first position so that the first aperture is aligned with the primary optical axis, and
if the apparatus is configured to be in the second mode, the movable aperture plate is positioned in the second position so that the first aperture is positioned away from the primary optical axis.

68. The apparatus of clause 67, wherein the movable aperture plate further includes a second aperture larger than the first aperture, wherein:
if the apparatus is configured to be in a third mode, the second aperture is positioned in a fifth position so that the second aperture is aligned with the primary optical axis to block the second charged particle beamlet and to produce higher current probe spot on the sample than with the first aperture.

69. The apparatus of any one of clauses 39-66, wherein the movable aperture plate includes a first aperture and a second aperture, wherein:
if the apparatus is configured to be in the first mode, the movable aperture plate is positioned in the first position so that the first aperture is aligned with the primary optical axis, and
if the apparatus is configured to be in the second mode, the movable aperture plate is positioned in the second position so that the second aperture is aligned with the primary optical axis.

70. The apparatus of clause 69, wherein the second aperture is larger than the first aperture.

71. The apparatus of any one of clauses 39-70, wherein the movable aperture plate is a circular-shaped plate.

72. The apparatus of clause 71, wherein the movable aperture plate rotates around the primary optical axis.

A non-transitory computer readable medium may be provided that stores instructions for a processor of a controller (e.g., controller 50 of FIG. 1) to carry out the operation mode switching between a multi-beam mode and a single-beam mode (e.g., controlling a beam separator or a single-beam detection device of FIGS. 8A and 8B). Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A charged particle beam apparatus for inspecting a sample, comprising:
a charged particle beam source configured to emit a charged particle beam along a primary optical axis;
a first aperture plate configured to form a plurality of charged particle beamlets from the charged particle beam;
a second aperture plate, movable between a first position and a second position; and
a controller having circuitry and configured to change the configuration of the apparatus to switch between a first mode and a second mode, wherein:
in the first mode:
the second aperture plate is positioned in the first position, and
the first aperture plate and the second aperture plate are configured to allow an on-axis charged particle beamlet with respect to the primary optical axis, to pass through, and
in the second mode:
the second aperture plate is positioned in the second position, and
the first aperture plate and the second aperture plate are configured to allow the on-axis charged particle beamlet and an off-axis charged particle beamlet with respect to the primary optical axis, to pass through,
wherein the first mode is a single-beam mode and the second mode is a multi-beam mode.

2. The apparatus of claim 1, wherein the second aperture plate is configured to block the off-axis charged particle beamlet when the apparatus operates in the first mode.

3. The apparatus of claim 1, wherein the first aperture plate is positioned between the charged particle beam source and the second aperture plate when the apparatus operates in the first mode.

4. The apparatus of claim 1, further comprising:
a condenser lens configured to change paths of the plurality of charged particle beamlets to form a plurality of images of the charged particle beam source on an image plane.

5. The apparatus of claim 4, wherein the second aperture plate is positioned between the first aperture plate and the condenser lens when the apparatus operates in the first mode.

6. The apparatus of claim 4, wherein the condenser lens is positioned between the first aperture plate and the second aperture plate when the apparatus operates in the first mode.

7. The apparatus of claim 4, wherein the condenser lens includes a first deflector and a second deflector, and wherein the second aperture plate is positioned between the first deflector and the second deflector when the apparatus operates in the first mode.

8. The apparatus of claim 1, wherein the second aperture plate is positioned between the charged particle beam source and the first aperture plate when the apparatus operates in the first mode.

9. The apparatus of claim 1, further comprising:
a beam separator configured to deflect secondary electrons generated from the sample; and
a first electron detection device configured to detect the secondary electrons when the apparatus operates either in the first mode or in the second mode.

10. The apparatus of claim 9, wherein the controller includes circuitry to:
control the beam separator, either in the first mode or in the second mode, to deflect the secondary electrons towards the first electron detection device, wherein the first electron detection device is aligned with a first secondary optical axis.

11. The apparatus of claim 1, further comprising:
a beam separator configured to deflect secondary electrons generated from the sample;
a first electron detection device configured to detect the secondary electrons when the apparatus operates in the second mode; and
a second electron detection device configured to detect the secondary electrons when the apparatus operates in the first mode.

12. The apparatus of claim 11, wherein the controller includes circuitry to:
 control the beam separator, in the second mode, to deflect the secondary electrons towards the first electron detection device, wherein the first electron detection device is aligned with a first secondary optical axis, and
 disable the beam separator, in the first mode, to allow the secondary electrons to travel towards the second electron detection device.

13. A method of inspecting a sample using a charged particle beam apparatus including a first aperture plate configured to form a plurality of charged particle beamlets from a charged particle beam emitted by a charged particle beam source, the method comprising:
 moving a second aperture plate from a second position to a first position, wherein:
 in a first mode of operation, positioning the second aperture plate at the first position enables an on-axis charged particle beamlet with respect to a primary optical axis to pass through a combination of the first and second aperture plates, and
 in a second mode of operation, positioning the second aperture plate at the second position enables an on-axis and an off-axis charged particle beamlet to pass through the combination of the first and second aperture plates, wherein the first mode is a single-beam mode and the second mode is a multi-beam mode.

14. A non-transitory computer readable medium having instructions recorded thereon, the instructions being executable by at least one processor of a system to cause the system to perform a method of inspecting a sample using a charged particle beam apparatus including a first aperture plate configured to form a plurality of charged particle beamlets from a charged particle beam emitted by a charged particle beam source, the method comprising:
 moving a second aperture plate from a second position to a first position, wherein:
 in a first mode of operation, positioning the second aperture plate at the first position enables an on-axis charged particle beamlet with respect to a primary optical axis to pass through a combination of the first and second aperture plates, and
 in a second mode of operation, positioning the second aperture plate at the second position enables an on-axis and an off-axis charged particle beamlet to pass through the combination of the first and second aperture plates, wherein the first mode is a single-beam mode and the second mode is a multi-beam mode.

* * * * *